United States Patent
Maki et al.

(10) Patent No.: US 8,432,039 B2
(45) Date of Patent: Apr. 30, 2013

(54) INTEGRATED CIRCUIT DEVICE AND ELECTRONIC INSTRUMENT

(75) Inventors: Katsuhiko Maki, Chino (JP); Kazuhiro Adachi, Chino (JP)

(73) Assignee: Seiko Epson Corporation (JP)

( * ) Notice: Subject to any disclaimer, the term of this patent is extended or adjusted under 35 U.S.C. 154(b) by 311 days.

(21) Appl. No.: 12/974,230

(22) Filed: Dec. 21, 2010

(65) Prior Publication Data

US 2011/0156205 A1 Jun. 30, 2011

(30) Foreign Application Priority Data

Dec. 29, 2009 (JP) ................................ 2009-299052

(51) Int. Cl.
*H01L 23/485* (2006.01)
*H01L 23/64* (2006.01)

(52) U.S. Cl.
USPC ...................... 257/773; 257/786; 257/E23.02

(58) Field of Classification Search .................. 257/773, 257/786, E23.02
See application file for complete search history.

(56) References Cited

U.S. PATENT DOCUMENTS

| 7,360,192 | B2 * | 4/2008 | Komatsu et al. | 716/118 |
| 7,668,989 | B2 * | 2/2010 | Nonoyama et al. | 710/71 |
| 8,001,301 | B2 * | 8/2011 | Nonoyama et al. | 710/71 |
| 8,179,358 | B2 * | 5/2012 | Yajima et al. | 345/100 |
| 2006/0088136 | A1 | 4/2006 | Morie et al. | |
| 2012/0012842 | A1 * | 1/2012 | Kikuchi | 257/48 |

FOREIGN PATENT DOCUMENTS

JP 2006-157866 6/2006

* cited by examiner

*Primary Examiner* — Evan Pert
(74) *Attorney, Agent, or Firm* — Harness, Dickey & Pierce, P.L.C.

(57) ABSTRACT

An integrated circuit device includes a receiving circuit, a transmission circuit, and common pads common to the receiving circuit and the transmission circuit, which are disposed in such a way that the distance between the receiving circuit and the common pad, and the distance between the transmission circuit and the common pad become shorter, respectively.

14 Claims, 9 Drawing Sheets

INTEGRATED CIRCUIT DEVICE AND ELECTRONIC INSTRUMENT

The entire disclosure of Japanese Patent Application No. 2009-299052, filed Dec. 29, 2009, is expressly incorporated by reference herein.

BACKGROUND

1. Technical Field

An aspect of the present invention relates to an integrated circuit device, an electronic instrument.

2. Related Art

Integrated circuit devices for wireless communication are known in the past, and one of the prior art of such an integrated circuit device for wireless communication is disclosed in, for example, JP-A-2006-157866.

A receiving circuit of the integrated circuit device is provided with a low noise amplifier (LNA). The low noise amplifier amplifies receiving signals of very small amplitude, and outputs the amplified signals to a mixer section in the subsequent stage. Therefore, high receiving sensitivity is required for the low noise amplifier. In addition, a transmission circuit of the integrated circuit device for wireless communication is provided with a power amplifier. In order to transmit electric waves through an antenna, high transmission power is required for the power amplifier.

Accordingly, it is desirable to provide an integrated circuit device capable of increasing both the receiving sensitivity of the receiving circuit and the transmission power of the transmission circuit.

SUMMARY

According to some aspects of the present invention, an integrated circuit device, an electronic instrument and the like are provided, capable of increasing the receiving sensitivity of a receiving circuit and the transmission power of a transmission circuit.

One aspect of the present invention relates to an integrated circuit device including a first pad for a first signal that constitutes a differential signal; a second pad for a second signal that constitutes the differential signal; a receiving circuit that receives a signal through the first pad and the second pad, respectively; and a transmission circuit that transmits a signal through the first pad and the second pad, respectively, wherein when a direction orthogonal to a first direction is defined as a second direction, the first pad and the second pad are disposed in regions "toward the first direction" (i.e. in regions "in the first direction") from the receiving circuit and the transmission circuit is disposed in a region toward the second direction from the first pad and the second pad.

According to one aspect of the present invention, the receiving circuit receives a signal through the first and second pads, respectively, and the transmission circuit transmits a signal through the first and second pads, respectively. The first and second pads are disposed toward the first direction from the receiving circuit, and the transmission circuit is disposed toward the second direction from the first and second pads. Accordingly, the first and second pads and the receiving circuit can be connected through short paths, allowing the receiving sensitivity of the receiving circuit to be increased. In addition, the first and second pads and the transmission circuit can be connected through short paths, allowing the transmission power of the transmission circuit to be increased. As a result, an integrated circuit device capable of increasing both receiving sensitivity and transmission power can be provided.

In addition, according to one aspect of the present invention, a first pad wiring connecting the first pad and the receiving circuit and a second pad wiring connecting the second pad and the receiving circuit may be formed in an uppermost metal layer.

When the first and second pad wirings are formed in the uppermost metal layer in this way, the parasitic resistance and the like of the first and second pad wirings can be reduced. Accordingly, the receiving sensitivity of the receiving circuit connected to the first and second pads by the first and second pad wirings can be further increased.

In addition, according to one aspect of the present invention, a third pad wiring connecting the first pad and the transmission circuit and a fourth pad wiring connecting the second pad and the transmission circuit may be formed in the uppermost metal layer, and the second pad wiring and the third pad wiring may be wired so as not to intersect with each other in a plan view.

When the third and fourth pad wirings are formed in the uppermost metal layer in this way, the parasitic resistance and the like of the third and fourth pad wirings can be reduced. Accordingly, the transmission power of the transmission circuit connected to the first and second pads by the third and fourth pad wirings can be increased. In addition, when the second pad wiring and the third pad wiring are wired so as not to intersect with each other in a plan view, the first and second pads and the receiving circuit and transmission circuit can be connected by the first to fourth pad wirings on the uppermost metal layer without having to switch the connection by a wiring on a lower metal layer. Accordingly, a situation and the like in which parasitic resistance increases due to switching of the connection using the wiring on the lower metal layer can be prevented.

Further, according to one aspect of the present invention, the third pad wiring may be wired along the second direction in a region toward the first direction from the first pad and the second pad.

This can facilitate the wiring of the second pad wiring and the third pad wiring so as not to intersect with each other in a plan view.

Moreover, according to one aspect of the present invention, a first electrostatic protection element for the first pad may be disposed in a region toward the first direction from the first pad, and a second electrostatic protection element for the second pad may be disposed in a region toward the first direction from the second pad.

This allows the first and second pads and the first and second electrostatic protection elements to be connected through short paths, allowing electrostatic discharge withstand voltage and the like to be increased.

Moreover, according to one aspect of the present invention, the integrated circuit device includes a first AC coupling capacitor provided between a first signal input node and the first pad for the first signal of the receiving circuit, and a second AC coupling capacitor provided between a second signal input node and the second pad for the second signal of the receiving circuit, wherein the first capacitor and the second capacitor may be a capacitor with an MIM (Metal-Insulator-Metal) structure.

This allows a large capacity value to be obtained with a small surface area, and the deterioration and the like of receiving characteristics due to the voltage-dependence of the capacity value to be prevented. In addition, electrostatic discharge withstand voltage and the like can be increased.

Further, according to one aspect of the present invention, when a direction opposite to the first direction is defined as a third direction, a mixer section for down-conversion of the receiving circuit may be disposed in a region toward the third direction from the low noise amplifier of the receiving circuit, and a transmission signal generation circuit that generates a transmission signal may be disposed in a region toward the third direction from the transmission circuit.

This allows signal lines in a circuit of a receiving system and signal lines in a circuit of a transmission system to be connected through short paths, allowing an adverse effect exerted by the parasitic capacitance and the parasitic resistance of these signal lines on the receiving and transmission to be reduced.

Further, according to one aspect of the present invention, a power supply line that supplies power to the electrostatic protection element may be wired along the second direction in a region toward the first direction from the first pad and the second pad.

This can prevent a situation in which, due to a region where the power supply line is wired, the pad wiring becomes longer, reducing receiving sensitivity.

In addition, according to one aspect of the present invention, the receiving circuit includes a low noise amplifier with an inductor for receiving circuit as a load, and, when a direction opposite to the second direction is defined as a fourth direction, the inductor for receiving circuit may be disposed in a region toward the fourth direction from the low noise amplifier.

This can prevent the inductor from being disposed on the signal path of a receiving system, allowing the signal path of the receiving system to become shorter.

Further, according to one aspect of the present invention, the transmission circuit includes a power amplifier connected to the first pad and the second pad, and a preamplifier connected to the power amplifier and having an inductor for transmission circuit as a load, and the inductor for transmission circuit may be disposed in a region toward the second direction from the transmission circuit.

This can prevent the inductor from being disposed on the signal path of a transmission system, allowing the signal path of the transmission system to become shorter.

Moreover, according to one aspect of the present invention, a dummy wiring for equalizing the parasitic capacitance of the first pad and the parasitic capacitance of the second pad may be connected to the first pad wiring connecting the first pad and the receiving circuit or the second pad wiring connecting the second pad and the receiving circuit.

Providing such a dummy wiring allows the parasitic capacitances of the first and second pads to be equalized, allowing the receiving and transmission of well-balanced differential signals to be achieved.

In addition, another aspect of the present invention relates to an integrated circuit device including a first pad for a first signal that constitutes a differential signal; a second pad for a second signal that constitutes the differential signal; a receiving circuit that receives a signal through the first pad and the second pad, respectively; and a transmission circuit that transmits a signal through the first pad and the second pad, respectively, wherein a first pad wiring connecting the first pad and the receiving circuit and a second pad wiring connecting the second pad and the receiving circuit are formed in an uppermost metal layer, a third pad wiring connecting the first pad and the transmission circuit and a fourth pad wiring connecting the second pad and the transmission circuit are formed in the uppermost metal layer, and the second pad wiring and the third pad wiring are wired so as not to intersect with each other in a plan view.

According to the other aspect of the present invention, since the first and second pad wirings are formed in the uppermost metal layer, the parasitic resistance and the like of the first and second pad wirings can be reduced. Accordingly, the receiving sensitivity of the receiving circuit connected to the first and second pads by the first and second pad wirings can be increased. In addition, since the third and fourth pad wirings are formed in the uppermost metal layer, the parasitic resistance and the like of the third and fourth pad wirings can be reduced. Accordingly, the transmission power of the transmission circuit connected to the first and second pads by the third and fourth pad wirings can be increased. Further, according to the other aspect of the present invention, the second pad wiring and the third pad wiring are wired so as not to intersect with each other in a plan view. Accordingly, the first and second pads and the receiving circuit and transmission circuit can be connected by the first to fourth pad wirings on the uppermost metal layer without having to switch the connection by a wiring on a lower metal layer. Accordingly, a situation and the like in which parasitic resistance and the like increase due to switching of the connection using the wiring on the lower metal layer can be prevented.

Moreover, another aspect of the present invention relates to an electronic instrument including the integrated circuit device according to any of the above aspects.

DETAILED DESCRIPTION OF EXEMPLARY EMBODIMENTS

A preferred embodiment of the present invention will now be described in detail. Note that the present embodiment described below does not unreasonably limit the contents of the present invention described in claims, and not all the components described in the present embodiment are required as a solution of the present invention.

1. Configuration

Figure 1:
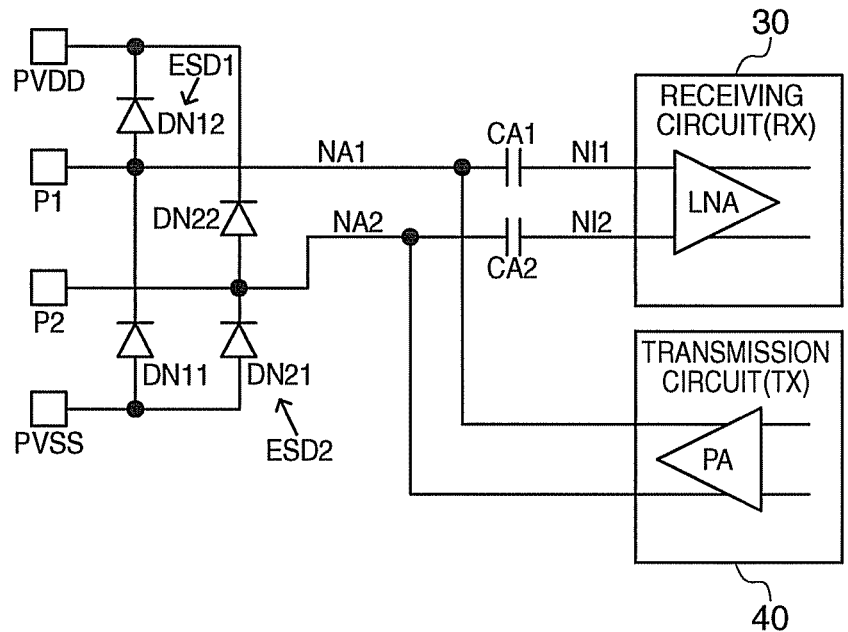
FIG. 1 shows an example of a configuration of an integrated circuit device according to an embodiment.

FIG. 1 shows an example of a configuration of an integrated circuit device according to the present embodiment. The integrated circuit device according to the present embodiment includes first and second pads P1 and P2, a receiving circuit 30 and a transmission circuit 40. In addition, the integrated circuit device may include electrostatic protection elements ESD1 and ESD2, AC coupling capacitors CA1 and CA2, a pad for VDD, PVDD, and a pad for VSS, PVSS. Note that various modifications and alterations may be made, including omission of some of these components (e.g., electrostatic protection element) and addition of other components.

The first and second pads P1 and P2 are external connecting terminals for receiving signals from the outside and for outputting signals to the outside, and are connected to a bonding wire, for example. For example, the pads P1 and P2 are connected to an antenna, a matching circuit and the like constituted by an inductor and the like, and receive RF (Radio Frequency) input signals or output RF output signals. Specifically, the first pad P1 is a pad for a first signal (non-inverse signal, positive-side signal) constituting a differential signal, and the second pad P2 is a pad for a second signal (inverse signal, negative-side signal) constituting a differential signal.

An on-chip antenna may be formed using a so-called W-CSP (Wafer level Chip Size Package) technique or the like, or an antenna may be realized by an external component of an integrated circuit device (IC chip). Further, the pads PVDD and PVSS receive a high voltage-side power supply VDD and a low voltage-side power supply VSS from the outside, respectively.

The receiving circuit (RX) 30 receives signals through the pads P1 and P2. Specifically, the receiving circuit 30 is connected to the pads P1 and P2 through the AC coupling capacitors CA1 and CA2. The receiving circuit 30 receives first and second differential signals from the pads P1 and P2. For example, the receiving circuit 30 performs amplification and filtering of input signals. The receiving circuit 30 includes a low noise amplifier LNA (input amplifier), for example.

The transmission circuit (TX) 40 transmits signals through the pads P1 and P2. Specifically, the transmission circuit 40 is connected to the pads P1 and P2. For example, the transmission circuit 40 performs amplification and amplitude modulation of transmission signals. The transmission circuit 40 includes a power amplifier PA (output amplifier), for example.

The first capacitor CA1 is provided between a first signal input node NI1 and the pad P1 for a first signal (non-inverse signal) of the receiving circuit 30. The second capacitor CA2 is provided between a second signal input node NI2 and the pad P2 for a second signal (inverse signal) of the receiving circuit 30. These capacitors CA1 and CA2 are capacitors for AC coupling (for DC cutting) of receiving signals. As described later, these capacitors CA1 and CA2 are capacitors with an MIM (Metal-Insulator-Metal) structure. Using such an MIM capacitor, electrostatic discharge withstand voltage (ESD withstand voltage) can be increased.

The low noise amplifier LNA provided on the receiving circuit 30 is a differential input type amplifier, and the power amplifier PA provided on the transmission circuit 40 is a differential output type amplifier. The non-inverse input terminal (positive-side input terminal) of the low noise amplifier LNA is connected to the node NI1 on the other end side of the capacitor CA1, and the inverse input terminal (negative-side input terminal) is connected to the node NI2 on the other end side of the capacitor CA2. In addition, the non-inverse output terminal (positive-side output terminal) of the power amplifier PA is connected to the node NA1 on one end side of the capacitor CA1, and the inverse output terminal (negative-side output terminal) is connected to the node NA2 on one end side of the capacitor CA2.

In FIG. 1, the electrostatic protection element ESD1 constituted by diodes DN11 and DN12 is provided on the pad P1 on the non-inverse (positive) side. In addition, the electrostatic protection element ESD2 constituted by diodes DN21 and DN22 is provided on the pad P2 on the inverse (negative) side. Specifically, the diode DN11 for electrostatic protection is provided between the node NA1 and the VSS node of the pad P1 with the VSS to NA1 direction as the forward direction, and the diode DN12 for electrostatic protection is provided between the node NA1 and the VDD node with the NA1 to VDD direction as the forward direction. Further, the diode DN21 for electrostatic protection is provided between the node NA2 and the VSS node of the pad P2 with the VSS to NA2 direction as the forward direction, and the diode DN22 for electrostatic protection is provided between the node NA2 and the VDD node with the NA2 to VDD direction as the forward direction.

Figure 2:
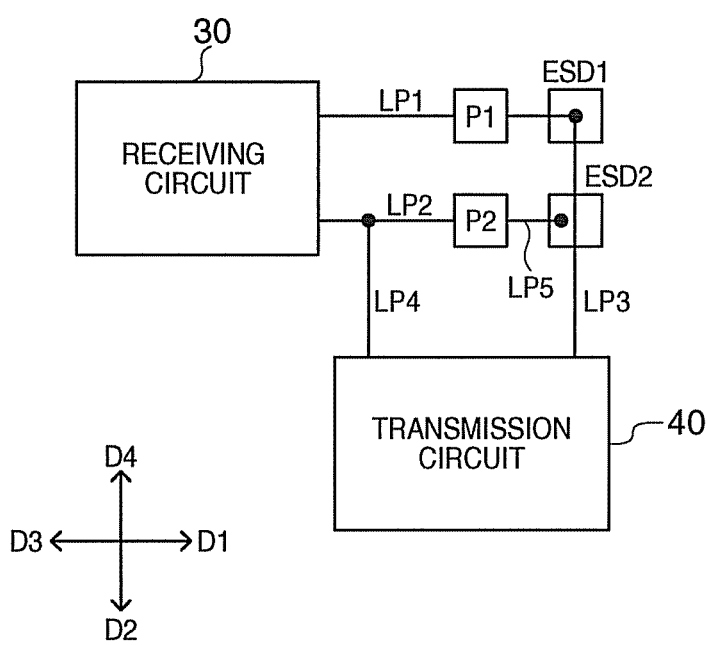
FIG. 2 shows an example of a layout of the integrated circuit device of the present embodiment.

FIG. 2 shows an example of a layout of the integrated circuit device of the present embodiment. In FIG. 2, a direction orthogonal to a first direction D1 is defined as a second direction D2. Further, a direction opposite to the first direction D1 is defined as a third direction D3, and a direction opposite to the second direction D2 is defined as a fourth direction D4. Specifically, facing the paper surface, right, down, left and up directions are the first direction D1, the second direction D2, the third direction D3 and the fourth direction D4, respectively. Note that the up, down, left and right directions are optional and not limited to FIG. 2; for example, the first direction D1 may indicate the left direction and the second direction D2 the up direction. Alternatively, the first direction D1 may indicate the down direction or the up direction, and the second direction D2 may indicate the left direction or the right direction.

In the integrated circuit device of FIG. 2, the first pad P1 for the first signal constituting a differential signal, the second pad P2 for the second signal constituting the differential signal, the receiving circuit 30 receiving signals through the pads P1 and P2, and the transmission circuit 40 for transmitting signals through the pads P1 and P2 are laid out.

Further, in FIG. 2, the pads P1 and P2 (external connecting terminals) are disposed in each region toward the D1 direction from the receiving circuit 30. In addition, the transmission circuit 40 is laid out in a region toward the D2 direction from the pads P1 and P2. That is, the pads P1 and P2 are disposed in each region toward the D1 direction from the receiving circuit 30 and toward the D4 direction from the transmission circuit 40. Specifically, the receiving circuit 30, the pads P1 and P2 and the transmission circuit 40 are laid out in such a way that the angle between the direction from the receiving circuit 30 toward the pads P1 and P2 and the direction from the pads P1 and P2 toward the transmission circuit 40 is 90 degrees (about 90 degrees). Namely, the receiving circuit system, the transmission circuit system and the pads are disposed so as to form 90 degrees with the pads as the apex. Cyclic wiring is arranged by layout, enabling connection of the pads P1 and P2, the receiving circuit 30 and the transmission circuit 40 only in the uppermost metal layer (uppermost wiring layer).

The layout to form 90 degrees in FIG. 2 allows the distance between the pads P1 and P2 and the receiving circuit 30 to be shortened. Accordingly, since the pads P1 and P2 and the receiving circuit 30 can be connected through short paths, the receiving sensitivity of the receiving circuit 30 can be increased. Further, the layout to form 90 degrees in FIG. 2 allows the distance between the pads P1 and P2 and the transmission circuit 40 to be shortened. Accordingly, since the pads P1 and P2 and the transmission circuit 40 can be connected through short paths, the transmission power of the transmission circuit 40 can be increased without having to perform electric power increase or the like. That is, in the integrated circuit device for wireless communication, both the receiving sensitivity of the receiving circuit 30 and the transmission power of the transmission circuit 40 can be increased.

Moreover, in FIG. 2, first to fourth pad wirings LP1, LP2, LP3 and LP4 are wired. The first pad wiring LP1 is a wiring connecting the pad P1 and the receiving circuit 30, and the second pad wiring LP2 is a wiring connecting the pad P2 and the receiving circuit 30. The pad wirings LP1 and LP2 are formed in an uppermost metal layer, described later. That is, LP1 and LP2 are pad wirings directly connected to the pads P1 and P2, respectively.

In addition, the third pad wiring LP3 is a wiring connecting the pad P1 and the transmission circuit 40, and the fourth pad wiring LP4 is a wiring connecting the pad P2 and the transmission circuit 40. The pad wirings LP3 and LP4 are also formed in the uppermost metal layer. That is, LP3 and LP4 are pad wirings directly connected to the pads P1 and P2, respectively.

In this way, by directly coupling the pad wirings LP1, LP2, LP3 and LP4 formed in the uppermost metal layer to wire the pads P1 and P2, the receiving circuit 30 and the transmission circuit 40, the parasitic resistance of the wirings can be reduced. That is, the uppermost metal layer has thicker film thickness and lower sheet resistance than lower metal layers. Since the pads P1 and P2, the receiving circuit 30 and the transmission circuit 40 are laid out so as to form 90 degrees as described above, a short path connection can be achieved. Accordingly, using these pad wirings LP1 to LP4 to connect the pads P1 and P2, the receiving circuit 30 and the transmission circuit 40 laid out so as to form 90 degrees can minimize the parasitic resistance. As a result, the receiving sensitivity of the receiving circuit 30 and the transmission power of the transmission circuit 40 can be increased.

In FIG. 2, the pad wiring LP2 and the pad wiring LP3 are wired so as not to intersect with each other in a plan view. Accordingly, the pads P1 and P2, the receiving circuit 30 and the transmission circuit 40 can be connected by the pad wirings LP1 to LP4 on the uppermost metal layer without having to switch the connection by a wiring on a lower metal layer. Accordingly, a situation in which a power loss occurs due to an increase in parasitic resistance or an increase in parasitic capacitance relative to the substrate can be prevented.

That is, as a comparative example of the present embodiment, a method in which a branch wiring branched from the pad wiring LP1 is connected to the transmission circuit 40 so as to intersect with the pad wiring LP2 is considered. However, in the method of the comparative example, the connection needs to be switched to the wiring on the lower metal layer in the crossing portion between the branch wiring and the pad wiring LP2. Accordingly, a problem occurs that the parasitic resistance of the wiring increases due to the parasitic resistance of the contact when the connection is switched and the parasitic resistance of the lower metal layer.

As compared with this, according to the method of the present embodiment in which the pad wiring LP2 and the pad wiring LP3 are wired so as not to intersect with each other as shown in FIG. 2, since such the switching of the connection to the wiring on the lower metal layer is not required, the problem described above can be prevented. The method in which the pad wiring LP2 and the pad wiring LP3 are wired so as not to intersect with each other may be applied to a method in which the pads P1 and P2, the receiving circuit 30, and the transmission circuit 40 are not laid out so as to form 90 degrees.

In addition, in FIG. 2, the pad wiring LP3 is wired along the D2 direction in a region toward the D1 direction from the pads P1 and P2. That is, the pad wiring LP3 is wired along the D2 direction in the region where the pad wiring LP3 does not intersect with the pad wirings LP1 and LP2, and is connected to the transmission circuit 40. This allows the pad wiring LP3 from the pad P1 to be connected to the transmission circuit without the pad wiring LP2 and the pad wiring LP3 intersecting with each other.

Further, in FIG. 2, the electrostatic protection element ESD1 (diodes DN11 and DN12) for the pad P1 is disposed in a region toward the D1 direction from the pad 21, and the electrostatic protection element ESD2 (diodes DN21 and DN22) for the pad P2 is disposed in a region toward the D1 direction from the pad P2. This allows the pads P1 and P2 to be connected through short paths to the electrostatic protection elements ESD1 and ESD2, respectively, allowing static electricity applied from the pads P1 and P2 to escape quickly to the VDD side and VSS side through the electrostatic protection elements ESD1 and ESD2. As a result, the electrostatic discharge withstand voltage of the integrated circuit device can be increased.

When the method in which the pad wiring LP3 is wired in the D2 direction in a region toward the D1 direction from the pad P1 is adopted, the electrostatic protection element ESD1 is disposed toward the D1 direction from the pad P1, allowing the pad wiring LP3 to be connected to the electrostatic protection element ESD1 easily. That is, since the electrostatic protection element EDS1 is disposed on the wiring route of the pad wiring LP3, LP3 and ESD1 can be connected easily to each other.

When the electrostatic protection element ESD2 is disposed toward the D1 direction from the pad P2, a pad wiring LP5 is required to connect the pad P2 and the electrostatic protection element ESD2. When the pad wiring LP3 is wired in the D2 direction in a region toward the D1 direction from the pad P1, the pad wiring LP3 is wired so that the pad wiring LP3 does not intersect with the pad wiring LP5.

2. Low Noise Amplifier, Power Amplifier

Figure 3A:
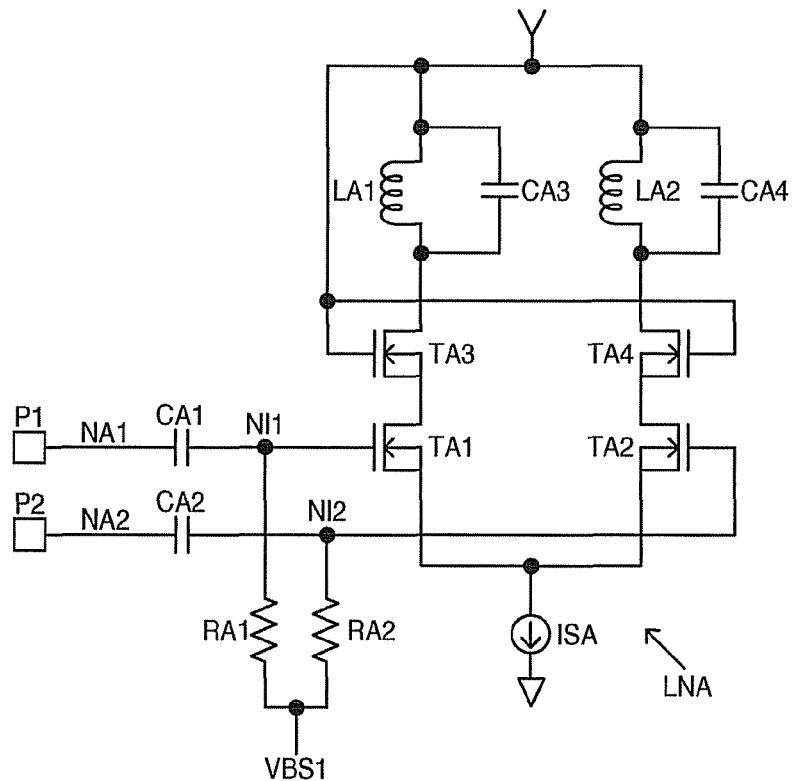
FIG. 3A and FIG. 3B shows an example of a configuration of a low noise amplifier and a power amplifier, respectively.

FIG. 3(A) shows an example of a configuration of a low noise amplifier LNA. The low noise amplifier LNA includes N-type (first conductivity type in a broad sense) transistors TA1, TA2, TA3 and TA4, a current source ISA, inductors LA1 and LA2 for receiving circuit, and capacitors CA3 and CA4. The low noise amplifier LNA also includes resistors RA1 and RA2.

The transistors TA1 and TA2 are differential input transistors, and the nodes NI1 and NI2 are connected to the gates thereof, and the current source ISA is connected to the sources thereof. The transistors TA3 and TA4 are transistors in cascade connection for suppressing mirror effects, and the VDD node, for example, is connected to the gates thereof, and the drains of the transistors TA1 and TA2 are connected to the sources thereof.

The inductor LA1 and the capacitor CA3, and the inductor LA2 and the capacitor CA4 are load circuits that constitute resonant circuits, respectively. The resonance frequency of these resonant circuits is set to be near the frequency of the carrier of a receiving signal. For example, when the frequency of the carrier is 2.4 GHz, the resonance frequency is also set to near 2.4 GHz. Providing a load circuit by such a resonant circuit allows a high frequency receiving signal to be amplified with the low noise.

The resistors RA1 and RA2 set the DC voltage of signals after AC coupling (DC cutting) by the capacitors CA1 and CA2, one end thereof being set to a DC bias voltage VBS1, and the other end thereof being connected to the nodes NI1 and NI2, respectively.

Figure 3B:
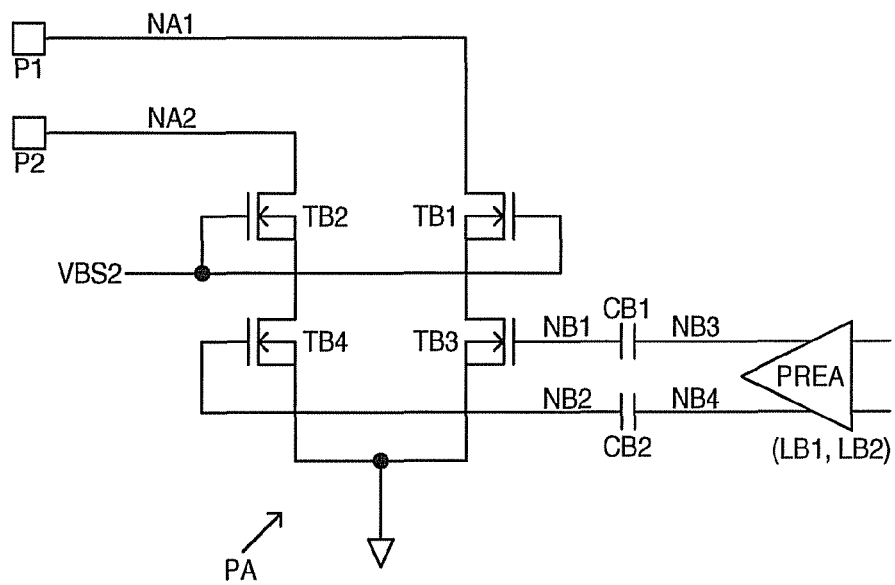

FIG. 3(B) shows an example of a configuration of a power amplifier PA and a preamplifier PREA. The power amplifier PA includes N-type transistors TB1, TB2, TB3 and TB4, and AC coupling capacitors CB1 and CB2.

The transistors TB1 and TB2 have a bias voltage VBS2 set to the gates thereof, and the nodes NA1 and NA2 are connected to the drains thereof, respectively. The transistors TB3 and TB4 have the nodes NB1 and NB2 at one end of capacitors CB1 and CB2 connected to the gates thereof, the transistors TB1 and TB2 connected to the drains thereof, and the VSS node connected to the sources thereof. The nodes NB3 and NB4 at the other end of the capacitors CB1 and CB2 are connected to the differential output terminals (positive side, negative side) of the preamplifier PREA.

The preamplifier PREA is an amplifier with inductor LB1, LB2 for transmission circuit as a load. As the preamplifier PREA, an inductor load circuit may be used, having the same configuration as that of the low noise amplifier LNA and the like of FIG. 3(A), for example.

3. Pad Wiring

A wiring method according to the present embodiment will now be described in detail. The present embodiment adopts a method in which the pads P1 and P2 and one end of capacitors CA1 and CA2 in FIG. 1 are connected by a pad wiring (wiring connected to the pad directly) formed in the uppermost metal layer (metal such as aluminum and alloy thereof). That is, the pad wiring LP1 from the pad P1 is directly coupled to one end of the capacitor CA1, and the pad wiring LP2 from the pad P2 is directly coupled to one end of the capacitor CA2. For example, the pad P1 and P2 are connected to one end of the capacitors CA1 and CA2, respectively, without mediation by wirings formed in the lower metal layers (first to $N^{th}-1$ metal layers) than the uppermost metal layer ($N^{th}$ metal layer; N is an integer greater than 3). Note that a connection route on the lower metal layer may be present in the connection route between the pads P1 and P2 and one end of the capacitors CA1 and CA2, but also in this case, according to the present embodiment, the connection route on the uppermost metal layer is always present.

Figure 4:
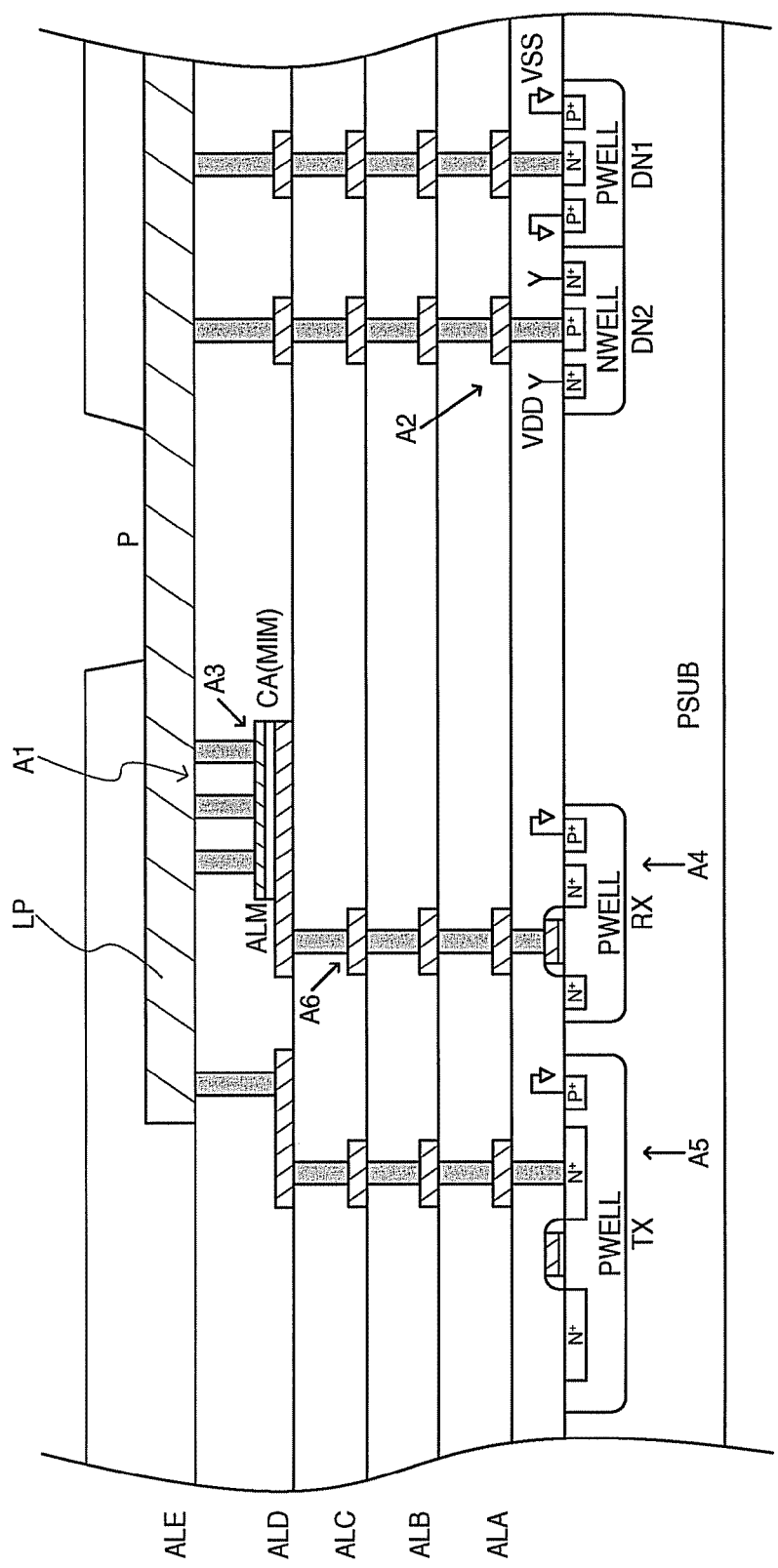
FIG. 4 shows a cross section diagram illustrating a wiring method according to the present embodiment.

FIG. 4 shows a cross section diagram of the integrated circuit device (semiconductor device) illustrating a wiring method according to the present embodiment. Note that, hereinafter, the pads P1 and P2 are representatively referred to as a pad P, the pad wirings LP1 to LP4 are representatively referred to as a pad wiring LP, and the capacitors CA1 and CA2 are representatively referred to as a capacitor CA as appropriate. Further, the diodes DN11 and DN21 are representatively referred to as a diode DN1, and the diodes DN12 and DN22 are referred to as a diode DN2.

As shown in A1 of FIG. 4, the pad wiring LP from the pad P is wired and connected to an electrode at one end of the capacitor CA. The pad wiring LP is formed in the uppermost metal layer ALE (fifth aluminum layer). In addition, the uppermost metal layer ALE is a metal layer that is thicker than the lower metal layers ALA, ALB, ALC and ALD (first to fourth aluminum layers); the thickness is, for example, five to ten times that of the lower metal layers or greater.

Specifically, the inductors LA1 and LA2 of the lower noise amplifier LNA of FIG. 3(A) are formed by winding the uppermost metal layer ALE in a spiral form, for example. When the uppermost metal layer ALE is made thick, the sheet resistance becomes lower, thus parasitic resistance can be reduced. Accordingly, the Q value of the resonant circuit formed by the inductor LA1 and capacitor CA3 or LA2 and CA4 can be increased, allowing the frequency selectivity to be improved. For this reason, the present embodiment adopts a manufacturing process whereby the uppermost metal layer ALE becomes thicker than the lower metal layers ALA, ALB, ALC and ALD to manufacture an integrated circuit device.

The inductor formed in the uppermost metal layer ALE may be used for the preamplifier PREA of the power amplifier PA of FIG. 3(B) and VCO of the PLL circuit generating a clock, for example, in addition to the low noise amplifier LNA of FIG. 3(A). By forming the inductor (inductor element) in the uppermost metal layer that is thicker than the lower metal layers (for example, five times or greater or ten times or greater), the sheet resistance becomes lower compared to when an inductor is formed in a lower metal layer (for example, one-fifth or lower or one-tenth or lower compared to when an inductor is formed in a lower metal layer), allowing the parasitic resistance of the inductor to be reduced. Further, compared to when the inductor is formed in the lower metal layer, the distance between the inductor and a substrate (semiconductor substrate) can be increased, allowing the parasitic capacitance of the inductor to be reduced. As a result, the parasitic resistance and parasitic capacitance are reduced, allowing the Q value of the inductor to be increased.

Focusing attention on the fact that the uppermost metal layer is thicker compared to when a normal manufacturing process is adopted, the present embodiment adopts a method in which the pad wirings LP (LP1 and LP2) formed in the uppermost metal layer ALE are connected to the capacitors CA (CA1 and CA2) directly. As a result, the parasitic resistance and the parasitic capacitance of the connection wiring between the pad P and the capacitor CA can be reduced, power losses can be reduced, and receiving sensitivity can be increased.

For example, when the parasitic resistance of the connection wiring between the pad P and the capacitor CA increases, the noise due to the parasitic resistance increases, deteriorating the SNR. In addition, there is a problem that the power of the signal received through an antenna and the like is consumed by the resistance component of the parasitic resistance.

On the other hand, according to the present embodiment, the parasitic resistance of the connection wiring between the pad P and capacitor CA can be reduced, therefore, the noise due to the parasitic resistance can be reduced, improving the SNR. In addition, a situation in which the power of the signal received through an antenna and the like is consumed by the resistance component of the parasitic resistance can be minimized and the receiving sensitivity can be increased.

Further, when the parasitic capacitance between the connection wiring from the pad P to the capacitor CA and VSS (GND) increases, many of high-frequency components of the receiving signal flow to the VSS side. Therefore, the high-frequency components of the signal transmitted to the low noise amplifier LNA side through the AC coupling capacitor CA are attenuated, and the receiving sensitivity of the low noise amplifier LNA and the like is reduced.

As compared with this, according to the wiring method of FIG. 4, the pad wiring LP is formed in the uppermost metal layer ALE that is thicker than the lower metal layer. Accordingly, since the parasitic resistance of the pad wiring LP connecting the pad P and the capacitor CA is reduced, the cut-off frequency of the low-path filter from the CR circuit formed by the parasitic resistance and the parasitic capacitance increases. Accordingly, the attenuation by this low-path filter of high-frequency components of a signal can be prevented, and receiving sensitivity and the like of the low noise amplifier LNA can be increased.

In addition, according to the wiring method of FIG. 4, since the wiring route from the pad P to the capacitor CA is formed by the pad wiring LP on the uppermost metal layer, the distance between the wiring route and the semiconductor substrate PSUB set to VSS can be increased. Accordingly, the parasitic capacitance between the wiring route and VSS can be reduced, high-frequency components of a signal flowing to the VSS side can be reduced, and the receiving sensitivity and the like of the low noise amplifier LNA can be increased.

Figure 5:
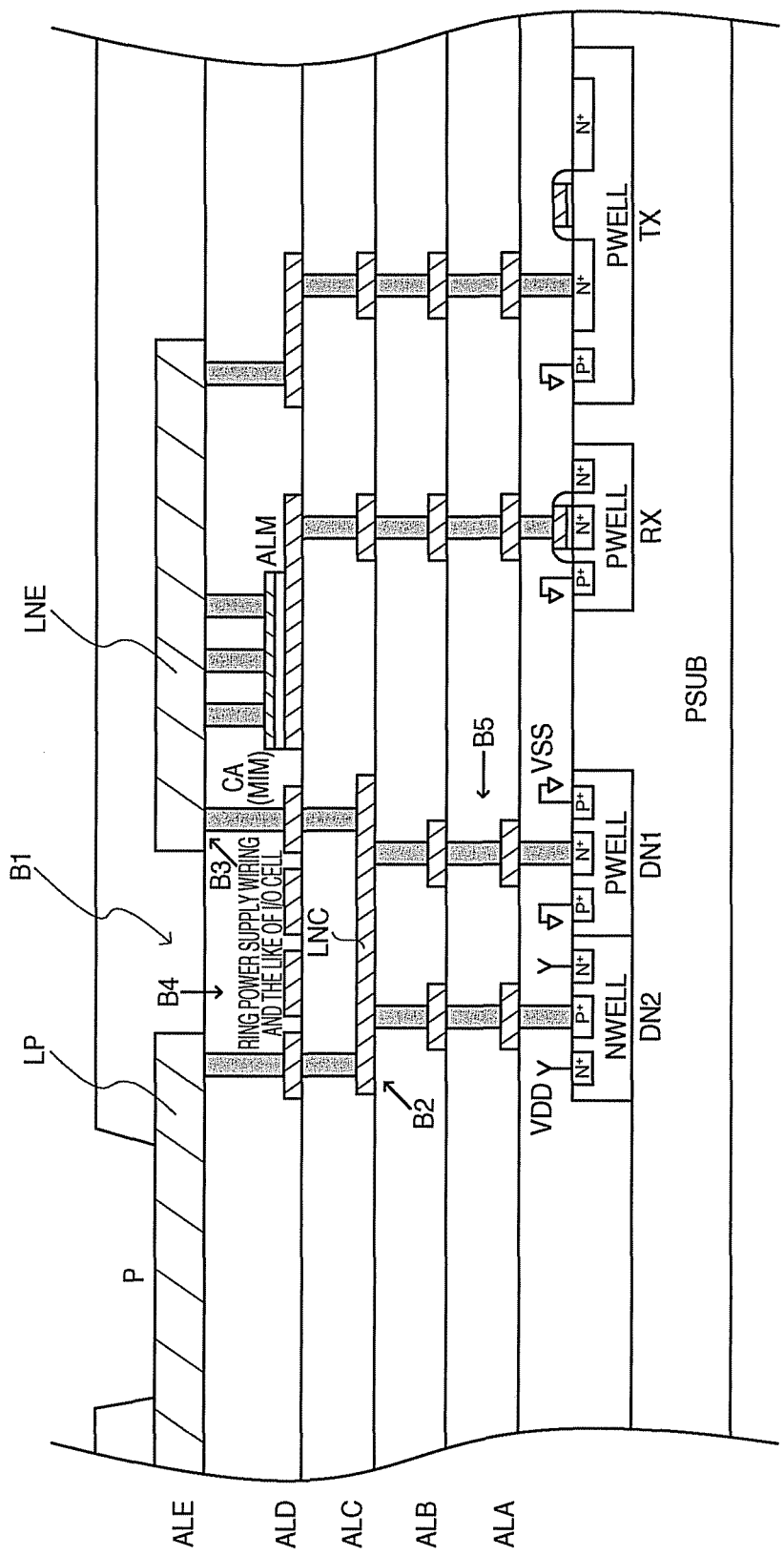
FIG. 5 shows a cross section diagram illustrating a wiring method of a comparative example.

FIG. 5 shows a cross section diagram illustrating a wiring method of a comparative example, for example. In this wiring method of the comparative example, as shown in B1, the pad wiring LP from the pad P is not directly coupled to the capacitor CA. Specifically, after the pad wiring LP is connected to the wiring LNC of the lower metal layer ALC through a contact (via) as shown in B2, the pad wiring LP is connected to the wiring LNE on the uppermost metal layer ALE through the contact as shown in B3. Then, the wiring LNE is connected to one end of the capacitor CA. In this way, a signal wiring that does not intersect with the ring power supply wiring and the like of an I/O cell shown in B4 is achieved.

As described above, in the comparative example of FIG. 5, the pad P is connected to one end of the capacitor CA through the wiring LNC formed in the lower metal layer. On the other hand, according to the present embodiment of FIG. 4, the pad P is connected to one end of the capacitor CA only through the pad wiring LP formed in the uppermost metal layer ALE without mediation by the wiring LNC formed in the lower metal layer.

In addition, in the comparative example of FIG. 5, the wiring LNC on the lower metal layer ALC is connected to a cathode terminal (N-type impurity region) of the diode DN1 for electrostatic protection and the anode terminal (P-type impurity region) of the diode DN2 for electrostatic protection through a contact.

That is, the conventional wiring method like the comparative example of FIG. 5 adopts a method in which the pad wiring LP is not directly coupled to an internal circuit, but connected to the diodes DN1 and DN2 for electrostatic protection through the wiring LNC on the lower metal layer ALC, and then connected to the internal circuit. The reason for this is that the static electricity from the pad P is first transmitted to the diodes DN1 and DN2 to be flowed to the VSS and VDD sides, and then delayed in time to be transmitted to the internal circuit, therefore, it is thought that electrostatic discharge withstand voltage can be increased.

However, in the method of FIG. 5, as shown in B2, the wiring LNC formed in the lower metal layer ALC is present on the wiring route between the pad P and the capacitor CA. In addition, since the lower metal layer ALC is thin, and the sheet resistance of the wiring LNC is high, the parasitic resistance of the wiring route between the pad P and the capacitor CA increases compared to that of FIG. 4. Further, since the parasitic resistances of the contact connecting the pad wiring LP and the wiring LNC and the contact connecting the wiring LNC and the wiring LNE are added, the parasitic resistance of the wiring route between the pad P and the capacitor CA further increases, and, due to the parasitic resistance, the receiving sensitivity and the like of the receiving circuit is deteriorated.

Further, in FIG. 5, since the wiring LNC is formed in the lower metal layer ALC at a close distance to the substrate PSUB, the parasitic capacitance between VSS and PSUB is increased compared to when the pad wiring LP is directly coupled as shown in FIG. 4, and the high-frequency components of the signal flowing to the VSS side are increased.

Moreover, as shown in B4, since the ring power supply wiring of an I/O cell is present above the wiring LC, parasitic capacitance is generated also between the power supply wiring and PSUB, and the high-frequency components of the signal flowing to the ring power supply wiring side are also increased.

On the other hand, according to the method of the present embodiment of FIG. 4, the pad wiring LP is formed in the thick uppermost metal layer ALE, and no lower metal layer ALC and no contact for connecting to the lower metal layer ALC exist in the wiring route between the pad P and the capacitor CA. Therefore, the parasitic resistance can be reduced compared to that of FIG. 5. In addition, since the pad wiring LP is formed in the uppermost metal layer ALE, the distance from the substrate PSUB can be increased compared to that of FIG. 5, the parasitic capacitance is also reduced, and the receiving sensitivity is increased compared to that of FIG. 5.

Figure 6:
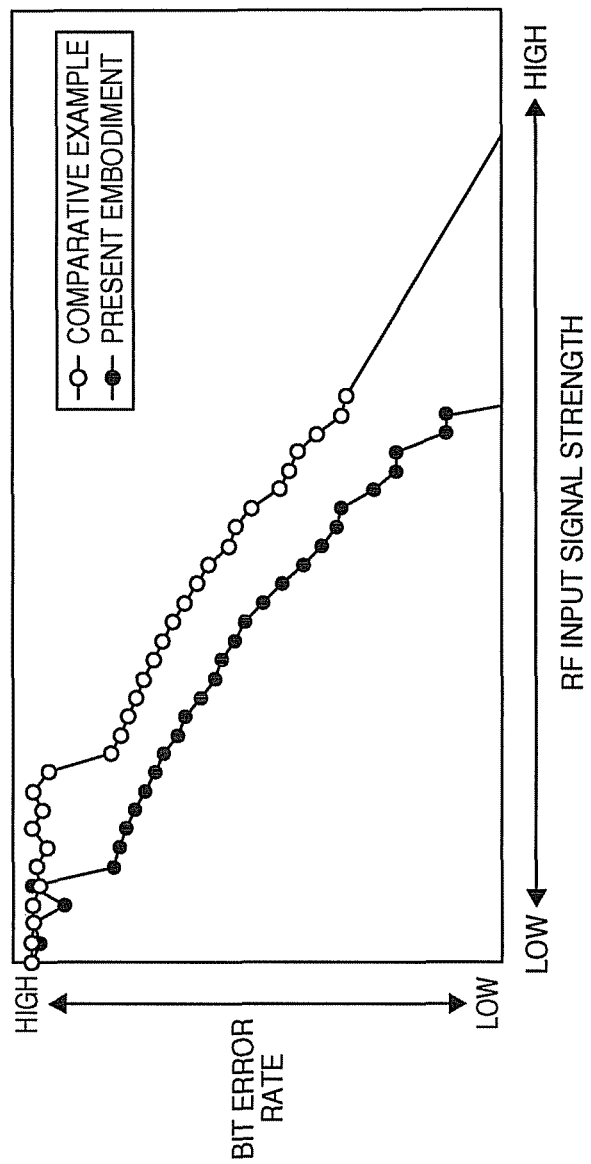
FIG. 6 shows a measurement result of a bit error rate.

For example, FIG. 6 is a measurement result showing the relationship between a bit error rate and the RF input signal strength. In FIG. 6, filled circles represent the measurement result of a case where the method of the present embodiment of FIG. 4 is adopted, and open circles represent the measurement result of a case where the method of the comparative example of FIG. 5 is adopted. As shown in FIG. 6, according to the present embodiment, the bit rate error can be significantly reduced compared to the comparative example, and the receiving sensitivity can be increased by about 3 dB, for example.

As shown in FIG. 4, according to the present embodiment, the diodes DN1 and DN2 that are electrostatic protection elements for pad P are provided. The pad wiring LP is wired so as to overlap with the diodes DN1 and DN2 (electrostatic protection elements in a broad sense) in a plan view. The contact formed in the overlap region of the pad wiring LP and the diodes DN1 and DN2 for electrostatic protection connects the pad wiring LP and the diodes DN1 and DN2 as shown in A2 of FIG. 2. Specifically, the cathode terminal of the diode DN1 and the anode terminal of the diode DN2 are connected through the pad wiring LP.

In this way, static electricity applied to the pad P is discharged to the VSS and VDD sides through the diodes DN1 and DN2, and the electrostatic discharge withstand voltage can be secured.

In this case, according to the present embodiment, an AC coupling capacitor CA is present between the gate of the transistor (TA1 and TA2 of FIG. 3(A)) constituting the receiving circuit 30 (RX) shown in A4 of FIG. 4 and the pad wiring LP. Accordingly, even if static electricity is applied to the pad P, a situation in which the gate or the like of the transistor of A4 is destroyed due to the static electricity can be prevented. Also, focusing attention on this point, the present embodiment adopts the method of directly coupling the pad wiring LP.

Further, in FIG. 3(A), the resistors RA1 and RA2 for setting the DC voltage of a signal after the AC coupling are connected to one end of the capacitors CA1 and CA2, respectively. Accordingly, high-pass filters are constituted by the capacitor CA1 and resistor RA1, and the capacitor CA2 and the resistor RA2. The frequency components of the static electricity (human body model and machine model) are considered to be in a lower frequency band than the cut-off frequencies of these high-pass filters. Accordingly, the attenuation effect of these high-pass filters can also protect the transistor and prevent the electrostatic discharge damage. In particular, the RF signal has a high frequency, therefore, the cut-off frequency of the high-pass filter constituted by CA1 and RA1 or CA2 and RA2 can be set to a high frequency. Accordingly, it can be expected that the electrostatic discharge damage is prevented by the attenuation effect of the high-pass filter.

In addition, in FIG. 4, the pad wiring LP is also connected to the drain of the transistor constituting the transmission circuit 40 (TX) shown in A5. Further, since the transistor of A5 is a transistor for power amplifier PA, the transistor size is usually large. Accordingly, since static electricity applied to the pad P is discharged to the VSS and VDD sides also through the diode formed in the drain of the transistor of A5, the electrostatic discharge withstand voltage can be secured even if the method of directly coupling the pad wiring LP is adopted.

When sufficient electrostatic discharge withstand voltage can be secured by the capacitor CA and the transistor of A5, an alternative embodiment in which no diode DN1, DN2 serving as an electrostatic protection element is provided is also possible.

In addition, as shown in A3, the capacitor CA has an MIM (Metal-Insulator-Metal) structure. Specifically, the electrode at one end of the capacitor CA is formed in the lower metal layer ALD than the uppermost metal layer ALE. Further, the electrode at the other end of the capacitor CA is formed in an MIM metal layer ALM formed between the uppermost metal layer ALE and the lower metal layer ALD.

By adopting such a capacitor CA with an MIM structure, an insulator film (dielectric, oxide film) can be made thin, therefore, a large capacitance value ban be acquired with a small layout area. Moreover, the capacitor CA with an MIM structure has low dependence of voltage, therefore, deterioration of analog characteristics can be suppressed.

In A3 of FIG. 4, the electrode at the other end of the capacitor CA is formed in the metal layer ALD next to the uppermost metal layer ALE. Accordingly, the distance between the capacitor CA and the substrate PSUB can be increased, and the fringe capacitance of the capacitor CA (parasitic capacitance between the fringe of CA and PSUB) can also be reduced. Accordingly, the high-frequency components of a signal flowing to the VSS side can be reduced, and the receiving sensitivity and the like can be increased.

As shown in A6 of FIG. 4, a contact connecting the electrode (ALD) of the other end of the capacitor CA and the input node (gate of the transistor of A4) of the receiving circuit 30 is formed in a region that does not overlap with the region where the capacitor CA is formed. In this way, by not forming the contact of A6 below the capacitor CA with an MIM structure, a situation in which the capacitance value of the capacitor CA deviates from a planned value (simulation value) can be prevented.

In A3 of FIG. 4, the pad wiring LP and the electrode (ALM) of one end of the capacitor CA with an MIM structure are preferably connected by a contact with a tungsten plug structure, for example. In this way, the parasitic resistance of the contact can be reduced and deterioration of the receiving sensitivity and the like can be prevented. In addition, the capacitor CA with a structure other than MIM may be formed. For example, the capacitor CA with a structure including polysilicon in a first layer and polysilicon in a second layer may be formed, for example.

Figure 7:
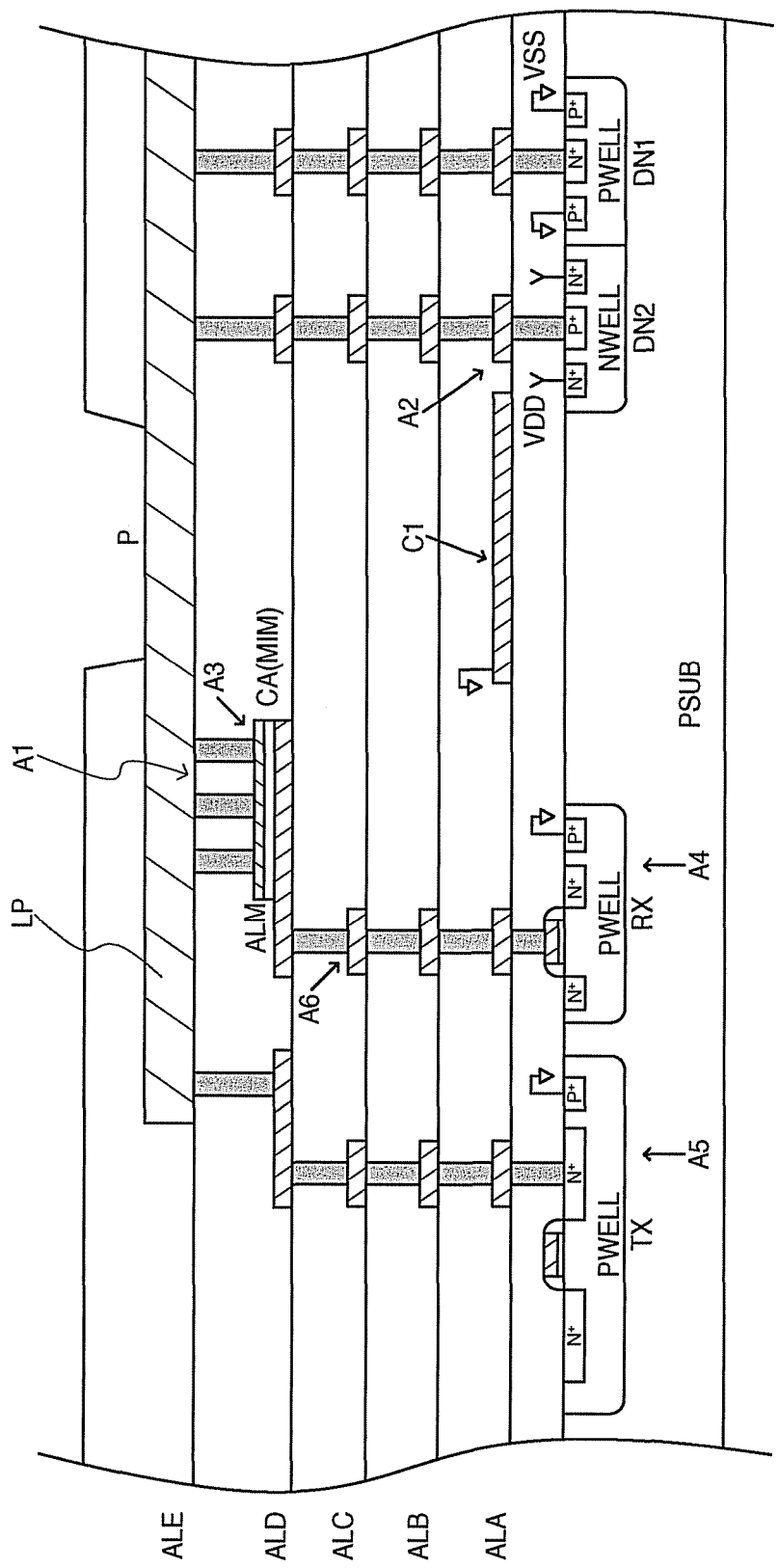
FIG. 7 shows a cross section diagram illustrating another example of a wiring method according to the present embodiment.

In addition, according to the present embodiment, a shield layer may be disposed below the pad P. For example, in C1 of FIG. 7, a shield layer formed in the lower metal layer ALA (first metal layer, first aluminum layer) is disposed below the pad P. The shield layer on ALA is connected to VSS, for example. When such a shield layer is provided, power losses of the input signal from the pad P can be reduced. In particular, when the undermost metal layer ALA is used as a shield layer, the distance between the pad P and the shield layer can be increased, therefore, the parasite capacitance between VSS and PSUB can be minimized. Note that, without limited to the undermost metal layer ALA, the shield layer may be formed in a metal layer that is at a higher level than ALA. Alternatively, the shield layer may be formed by a silicidized low-resistance polysilicon or a diffusion layer. Further, STI (Shallow Trench Isolation) may be formed below the pad P. That is, without forming the lower metal layers ALD, ALC, ALB and ALA than the uppermost metal layer ALE below the pad P, P-type wells are formed on the substrate PSUB, and an insulator film with an STI structure is formed over the P-type wells. For example, a groove is formed in the P-side well (substrate) and a silicon oxide film is embedded in the groove to form the STI.

4. Detailed Circuit Configuration

Figure 8:
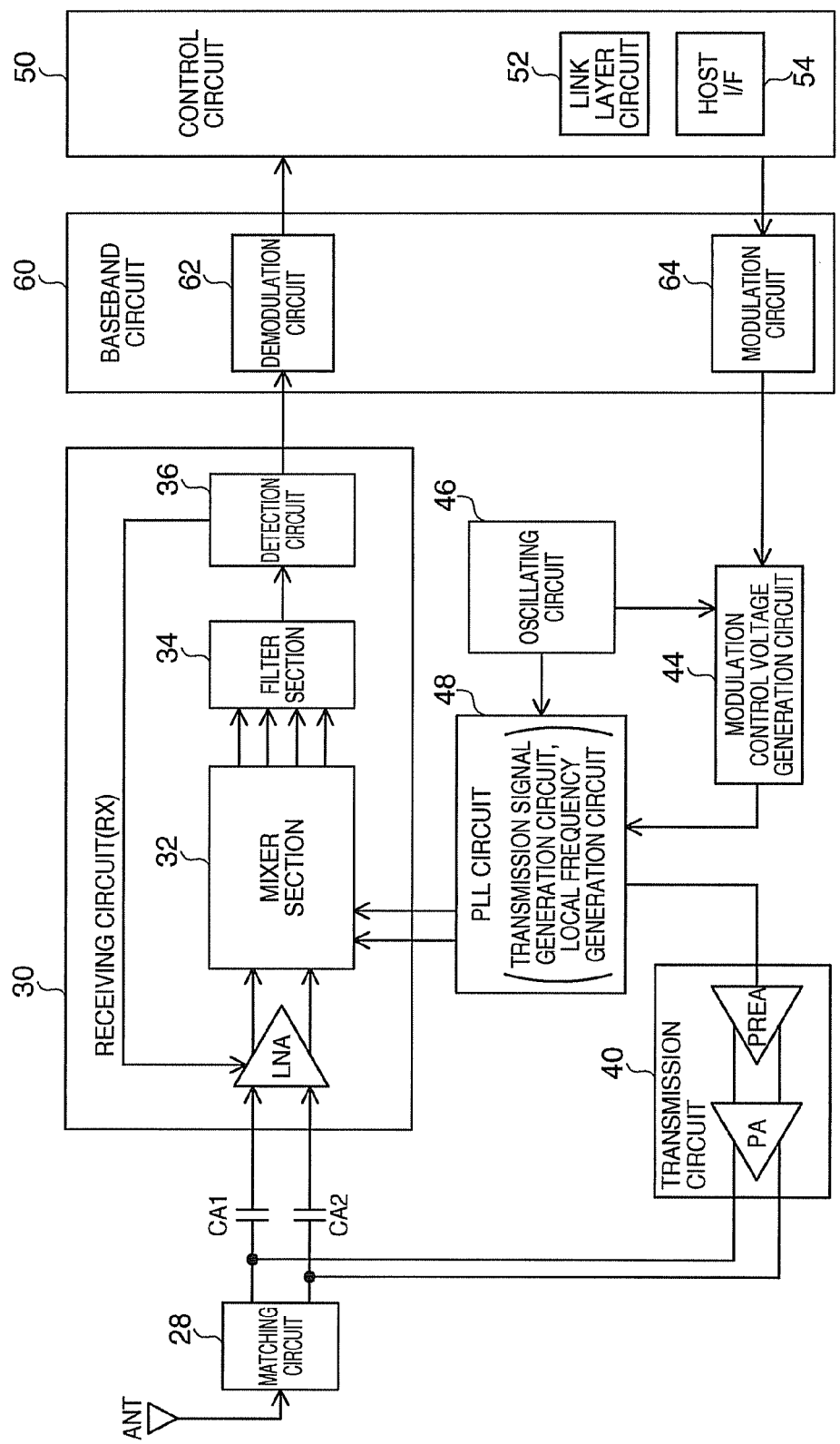
FIG. 8 shows an example of a detailed configuration of the integrated circuit device according to the present embodiment.

FIG. 8 shows an example of a detailed configuration of the integrated circuit device according to the present embodiment. The integrated circuit device includes a receiving circuit 30, a transmission circuit 40, a modulation control voltage generation circuit 44, an oscillating circuit 46, a PLL circuit 48, a control circuit 50 and a baseband circuit 60. The control circuit 50 includes a link layer circuit 52 and a host I/F 54, and the baseband circuit 60 includes a demodulation circuit 62 and a modulation circuit 64. Note that various modifications and alterations may be made, including omission of some of these components and addition of other components.

The receiving circuit 30 includes a low noise amplifier LNA, a mixer section 32, a filter section 34 and a detection circuit 36. The low noise amplifier LNA amplifies with low noise an RF receiving signal entered from an antenna ANT through a matching circuit 28. The mixer section 32 mixes the amplified receiving signal and a local signal (local frequency signal) from VCO for receiving of the PLL circuit 48 (local frequency generation circuit), and performs down-conversion. The filter section 34 filters the receiving signal after down-conversion. Specifically, the filter section 34 filters the band path realized by a complex filter and the like, and extracts a baseband signal while performing image rejection. The detection circuit 36 detects the signal strength of a desired wave in order to control the gain of LNA.

The demodulation circuit 62 provided on the baseband circuit 60 performs demodulation based on the signal from the receiving circuit 30. For example, the demodulation circuit 62 demodulates the signal modulated with FSK (frequency shift keying) on the transmission side, and outputs the received data after demodulation to the control circuit 50.

The modulation circuit 64 provided on the baseband circuit 60 modulates transmitted data from the control circuit 50. For example, the modulation circuit 64 modulates transmitted data with FSK, and outputs the transmitted data after modulation to the modulation control voltage generation circuit 44. The modulation control voltage generation circuit 44 performs A/D conversion of the transmitted data after modulation, and outputs the modulation control voltage acquired by the A/D conversion to the control voltage input terminal of the transmission VCO of the PLL circuit 48 (transmission signal generation circuit). The transmission VCO outputs the transmission signal with the frequency modulated by the modulation control voltage to the preamplifier PREA of the transmission circuit 40, and the power amplifier PA amplifies the output signal from the preamplifier PREA. Then, the transmission circuit 40 outputs the transmission signal amplified by the power amplifier PA to the antenna ANT.

The PLL circuit 48 generates various clock signals, local signals to the mixer section 32 and the like based on the oscillation clock signal from the oscillating circuit 46.

The control circuit 50 controls the entire integrated circuit device and performs various types of digital processing. In addition, the control circuit 50 has the link layer circuit 52 and the host I/F (interface) 54, for example, and performs protocol processing of the link layer, and interface processing with an external host.

5. Detailed Layout

Figure 9:
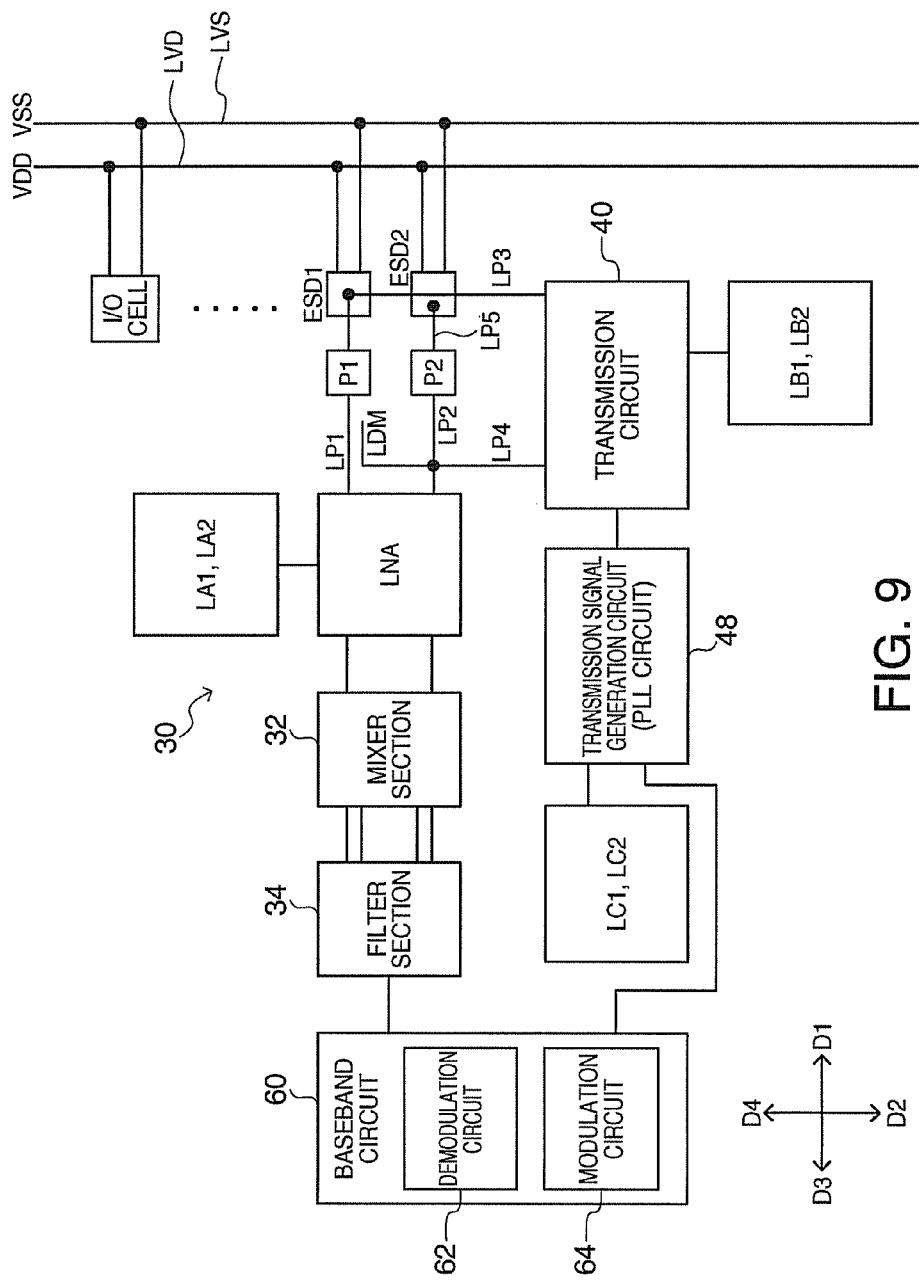
FIG. 9 shows an example of a detailed layout of the integrated circuit device according to the present embodiment.

FIG. 9 shows an example of a detailed layout of the integrated circuit device according to the present embodiment. In FIG. 9, the pads P1 and P2, electrostatic protection elements ESD1 and ESD2, the low noise amplifier LNA constituting the receiving circuit 30, the mixer section 32, the filter section 34, the transmission circuit 40, the transmission signal generation circuit 48 (PLL circuit), the baseband circuit 60 and the inductors LA1, LA2, LB1, LB2, LC1 and LC2 are laid out. In addition, the pad wirings LP1 to LP5, a dummy wiring LDM, power supply lines LVD and LVS of VDD and VSS are laid out.

In FIG. 9, the mixer section 32 for down-conversion of the receiving circuit 30 is disposed in a region toward the D3 direction from the low noise amplifier LNA of the receiving circuit 30. For example, the low noise amplifier LNA and the mixer section 32 are adjacently disposed along the D3 direction. The filter section 34 is disposed in a region toward the D3 direction from the mixer section 32, and the baseband circuit 60 is disposed in a region toward the D3 direction from the filter section 34. "Adjacently disposed" means to be disposed with no circuit block or circuit element in between.

The transmission signal generation circuit 48 that generates transmission signals (signals with modulated carrier frequency) is disposed in a region toward the D3 direction from the transmission circuit 40. For example, the transmission circuit 40 and the transmission signal generation circuit 48 are adjacently disposed along the D3 direction. The inductor LC1, LC2 for PLL circuit is disposed in a region toward the D3 direction from the transmission signal generation circuit 48, and the baseband circuit 60 is disposed in a region toward the D3 direction from the inductor LC1, LC2.

According to the layout of FIG. 9, the receiving signal from the pads P1 and P2 are received at the low noise amplifier LNA, the receiving signal after amplification from LNA is mixed at the mixer section 32, the output signal from the mixer section 32 is filtered at the filter section 34, and input into the demodulation circuit 62 of the baseband circuit 60. That is, a signal line in a circuit of a receiving system can be connected from the circuit in the previous stage to the circuit in the subsequent stage through a short path, allowing an adverse effect exerted by the parasitic capacitance and the parasitic resistance on the receiving to be minimized.

According to the layout of FIG. 9, it is possible that the modulation signal from the modulation circuit 64 of the baseband circuit 60 is input into the transmission signal generation circuit 48, the transmission signal from the transmission signal generation circuit 48 is input into the transmission circuit 40, and the transmission signal after amplification from the transmission circuit 40 is output to the external antenna through the pads P1 and P2. That is, a signal line in a circuit of a transmission system can be connected from the circuit in the previous stage to the circuit in the subsequent stage through a short path, allowing an adverse effect exerted by the parasitic capacitance and the parasitic resistance on the transmission to be minimized.

As described above, in FIG. 9, in the circuit of the receiving system, a signal flows from the pads P1 and P2 toward the baseband circuit 60 along the D3 direction, and in the circuit of the transmission system, a signal flows from the baseband circuit 60 toward the transmission circuit 40 along the D1 direction. In addition, in the present embodiment, the pads P1 and P2 are disposed in the D1 direction of the receiving circuit 30 (LNA), and the transmission circuit 40 is disposed in the D2 direction of the pads P1 and P2, as described above. That is, the receiving circuit 30, the pads P1 and P2 and the transmission circuit 40 are laid out so as to form 90 degrees. Therefore, when the flow of the signal at the circuit of the receiving system is in the D3 direction, and the flow of the signal at the circuit of the transmission system is in the D1 direction, the layout area can be minimized. Further, the pad wirings LP1 and LP2 from the pads P1 and P2 can be connected to the receiving circuit 30 (LNA) through short paths, and the pad wirings LP3 and LP4 from the transmission circuit 40 can be connected to the pads P1 and P2 through short paths. Accordingly, both of the minimization of the layout area and an increase in the receiving sensitivity, transmission power and the like can be realized.

In addition, in FIG. 9, the power supply lines LVD and LVS supplying power VDD and VSS to the electrostatic protection element (I/O cell) are disposed in regions toward the D1 direction from the pads P1 and P2 along the D2 direction. Specifically, the power supply lines LVD and LVS supply power VDD and VSS to electrostatic protection elements ESD1 and ESD2, and a plurality of I/O cells disposed at the periphery of the chip of the integrated circuit device.

That is, usually, such power supply lines LVD and LVS are disposed in a cyclic form in the inner peripheral region (internal region) of the region where the I/O cell and electrostatic protection element are disposed. On the other hand, in FIG. 9, the power supply lines LVD and LVS are disposed in the outer periphery (external region) of the region where the I/O cell and electrostatic protection element are disposed. This eliminates the need for wiring the power supply lines LVD and LVS so as to intersect with the pad wirings LP1 and LP2 and the like. Accordingly, a situation in which, due to the region where the power supply lines LDV and LVS are wired, the pad wirings LP1 and LP2 become longer, and increase in the parasitic resistance and parasitic capacitance reduces receiving sensitivity may be prevented. In addition, when the electrostatic protection elements ESD1 and ESD2 are disposed in the D1 direction from the pads P1 and P2, the power VDD and VSS can be supplied to the electrostatic protection elements ESD1 and ESD2 through short paths.

Further, according to the present embodiment, as shown in FIG. 3(A), the receiving circuit 30 includes the low noise amplifier LNA with the inductors LA1 and LA2 for receiving circuit as a load. As shown in FIG. 9, the inductor LA1, LA2 for receiving circuit is disposed in a region toward the D4 direction from the LNA.

As shown in FIG. 4(B), the transmission circuit 40 includes the power amplifier PA connected to the pads P1 and P2, and a preamplifier PREA connected to the power amplifier PA and having the inductor LB1, LB2 for transmission circuit as a load. As shown in FIG. 9, the inductor LB1, LB2 for transmission circuit is disposed in a region toward the D2 direction from the transmission circuit 40. Note that these inductors LA1, LA2, LB1 and LB2 and the like can be formed by wiring the metal wiring formed in the uppermost metal layer and the like in a spiral form, for example.

When the inductors LA1, LA2, LB1 and LB2 are disposed in this way, the inductors LA1, LA2, LB1 and LB2 are not disposed on the signal path of the receiving system (path along D3 direction), and the signal path of the transmission system (path along D1 direction). Therefore, the signal path of the receiving system and the signal path of the transmission system can be made shorter, allowing an adverse effect exerted by the parasitic capacitance and the parasitic resistance on the receiving and transmission on these paths to be minimized.

In addition, in FIG. 9, the dummy wiring LDM for equalizing the parasitic capacitance of the pad P1 and the parasitic capacitance of the pad P2 is connected to the pad wiring LP2. That is, in the layout to form 90 degrees of FIG. 9, the wiring connected to the pad P1 is longer, therefore, the parasitic capacitance of the pad P1 is larger than that of the parasitic capacitance of the pad P2. Accordingly, in order to equalize the parasitic capacitances of these pads P1 and P2, the dummy wiring LDM is connected to the pad wiring LP2 of the pad P2 having a lower parasitic capacitance. This allows the parasitic capacitances of the pads P1 and P2 to be equalized, allowing the receiving and transmission of well-balanced differential signals to be realized.

Note that, in the layout of FIG. 9, the pad P2 has a lower parasitic capacitance than that of the pad P1, therefore, the dummy wiring LDM is connected (added) to the pad wiring LP2 of P2. However, when the parasitic capacitance of the pad P1 is lower than that of the pad P2, the dummy wiring LDM may be connected to the pad wiring LP1 of P1.

6. Electronic Instrument

Figure 10:
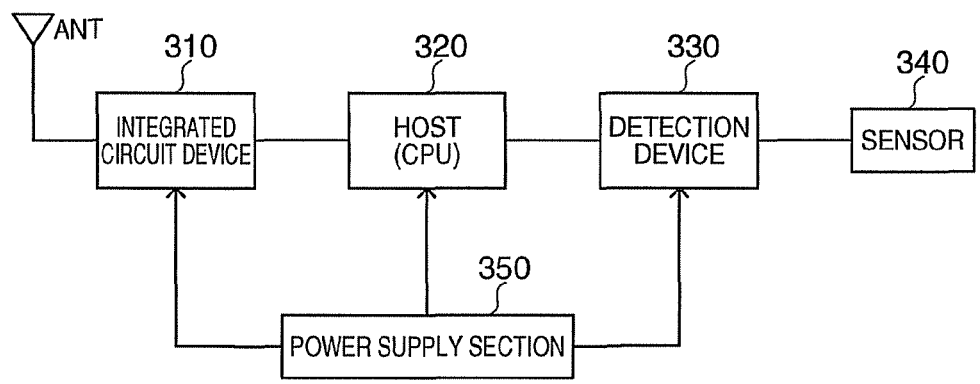
FIG. 10 shows an example of a configuration of an electronic instrument.

FIG. 10 shows an example of a configuration of an electronic instrument including an integrated circuit device 310 of the present embodiment. The electronic instrument includes an antenna ANT, the integrated circuit device 310, a host 320, a detection device 330, a sensor 340 and a power supply section 350. Note that the electronic instrument of the present embodiment is not limited to the configuration of FIG. 10, and various modifications and alterations may be made, including omission of some of these components (e.g., detection device, sensor, power supply section and the like) and addition of other components (e.g., operating section and output section).

The integrated circuit device 310 is a wireless circuit device achieved by a circuit configuration as shown in FIGS. 1 and 8, and receives and transmits signals from and to the antenna ANT. The host 320 controls the entire electronic instrument, and the integrated circuit device 310 and the detection device 330. The detection device 330 performs various types of detection processing (detection processing of physical quantity) based on a sensor signal from the sensor 340 (physical quantity transducer). For example, processing for detecting a desired signal from the sensor signal is performed, and the digital data after A/D conversion is output to the host 320. An example of the sensor 340 includes a smoke sensor, a light sensor, a motion sensor, a pressure sensor, a biometric sensor and a gyroscopic sensor. The power supply section 350 supplies power to the integrated circuit device 310, the host 320, the detection device 330 and the like, and receives power from a dry cell (round dry cell and the like) and a battery and the like.

Although the present embodiment has been described in detail as described above, a person having ordinary skill in the art easily understands that many modifications and alterations may be made without substantially departing from the novelties and effects of the present invention. Accordingly, the present invention includes all of such modifications and alterations. For example, a term (VSS node, VDD node and the like) that has been mentioned together with a different term having a broader meaning or the same meaning (first power supply node, second power supply node and the like) at least once in the specification and drawings may be replaced with the different term anywhere in the specification or drawings. In addition, the configuration and operation of the integrated circuit device and the electronic instrument are not limited to the description of the present embodiment, and various modified embodiments may be possible.

The invention claimed is:

1. An integrated circuit device, comprising:
   a first pad for a first signal that constitutes a differential signal;
   a second pad for a second signal that constitutes the differential signal;
   a receiving circuit that receives a signal through the first pad and the second pad, respectively; and
   a transmission circuit that transmits a signal through the first pad and the second pad, respectively,
   wherein when a direction orthogonal to a first direction is defined as a second direction,
   the first pad and the second pad are disposed in regions in the first direction from the receiving circuit and the transmission circuit is disposed in a region in the second direction from the first pad and the second pad.

2. The integrated circuit device according to claim 1, wherein
   a first pad wiring connecting the first pad and the receiving circuit and a second pad wiring connecting the second pad and the receiving circuit are formed in an uppermost metal layer.

3. The integrated circuit device according to claim 2, wherein
   a third pad wiring connecting the first pad and the transmission circuit and a fourth pad wiring connecting the second pad and the transmission circuit are formed in the uppermost metal layer, and
   the second pad wiring and the third pad wiring are wired so as not to intersect with each other in a plan view.

4. The integrated circuit device according to claim 3, wherein
   the third pad wiring is wired along the second direction in a region in the first direction from the first pad and the second pad.

5. The integrated circuit device according to claim 1, wherein
   a first electrostatic protection element for the first pad is disposed in a region in the first direction from the first pad, and
   a second electrostatic protection element for the second pad is disposed in a region in the first direction from the second pad.

6. The integrated circuit device according to claim 1, further comprising:
   a first AC coupling capacitor provided between a first signal input node and the first pad for the first signal of the receiving circuit, and
   a second AC coupling capacitor provided between a second signal input node and the second pad for the second signal of the receiving circuit,
   wherein the first capacitor and the second capacitor are a capacitor with an MIM (Metal-Insulator-Metal) structure.

7. The integrated circuit device according to claim 1, wherein
   when a direction opposite to the first direction is defined as a third direction, a mixer section for down-conversion of the receiving circuit is disposed in a region in the third direction from the low noise amplifier of the receiving circuit, and
   a transmission signal generation circuit that generates a transmission signal is disposed in a region in the third direction from the transmission circuit.

8. The integrated circuit device according to claim 1, wherein a power supply line that supplies power to an electrostatic protection element is wired along the second direction in a region in the first direction from the first pad and the second pad.

9. The integrated circuit device according to claim 1, wherein the receiving circuit includes a low noise amplifier with an inductor for receiving circuit as a load, and when a direction opposite to the second direction is defined as a fourth direction, the inductor for receiving circuit is disposed in a region in the fourth direction from the low noise amplifier.

10. The integrated circuit device according to claim 1, wherein the transmission circuit includes:

a power amplifier connected to the first pad and the second pad; and a preamplifier connected to the power amplifier and having an inductor for transmission circuit as a load, and the inductor for transmission circuit is disposed in a region in the second direction from the transmission circuit.

11. The integrated circuit device according to claim 1, wherein a dummy wiring for equalizing parasitic capacitance of the first pad and parasitic capacitance of the second pad is connected to a first pad wiring connecting the first pad and the receiving circuit or a second pad wiring connecting the second pad and the receiving circuit.

12. An integrated circuit device, comprising:

a first pad for a first signal that constitutes a differential signal;

a second pad for a second signal that constitutes the differential signal;

a receiving circuit that receives a signal through the first pad and the second pad, respectively; and a transmission circuit that transmits a signal through the first pad and the second pad, respectively, wherein a first pad wiring connecting the first pad and the receiving circuit and a second pad wiring connecting the second pad and the receiving circuit are formed in an uppermost metal layer, a third pad wiring connecting the first pad and the transmission circuit and a fourth pad wiring connecting the second pad and the transmission circuit are formed in the uppermost metal layer, and the second pad wiring and the third pad wiring are wired so as not to intersect with each other in a plan view.

13. An electronic instrument comprising an integrated circuit device according to claim 1.

14. An electronic instrument comprising an integrated circuit device according to claim 12.

* * * * *